United States Patent
Tsou

(10) Patent No.: US 9,939,463 B2
(45) Date of Patent: Apr. 10, 2018

(54) TEST CIRCUIT FOR TESTING A DEVICE-UNDER-TEST BY USING A VOLTAGE-SETTING UNIT TO PULL AN END OF THE DEVICE-UNDER-TEST TO A PREDETERMINED VOLTAGE

(71) Applicant: UNITED MICROELECTRONICS CORP., Hsin-Chu (TW)

(72) Inventor: Po-Wei Tsou, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 108 days.

(21) Appl. No.: 15/092,586

(22) Filed: Apr. 6, 2016

(65) Prior Publication Data

US 2017/0292976 A1    Oct. 12, 2017

(51) Int. Cl.
*G01R 1/20* (2006.01)
*G01R 31/26* (2014.01)

(52) U.S. Cl.
CPC ......... *G01R 1/206* (2013.01); *G01R 31/2639* (2013.01)

(58) Field of Classification Search
CPC ............ G01R 31/3008; G01R 19/0092; G01R 1/206; G01R 31/2639
USPC ................. 324/500, 750.01, 750.15, 750.26, 324/756.01–758.01, 76.11, 600; 257/685, 257/777; 438/15, 25–26
See application file for complete search history.

(56) References Cited

U.S. PATENT DOCUMENTS

| | | | |
|---|---|---|---|
| 6,838,869 B1 | 1/2005 | Rogers | |
| 2011/0166819 A1* | 7/2011 | Kojima | H03K 3/017 702/120 |
| 2011/0211374 A1* | 9/2011 | Yoshida | H02M 1/4225 363/37 |

OTHER PUBLICATIONS

Chang et al., Interconnect Capacitance Characterization Using Charge-Injection-Induced Error-Free (CIEF) Charge-Based Capacitance Measurement (CBCM), IEEE Transactions on Semiconductor Manufacturing, vol. 19, No. 1, Feb. 2006.

* cited by examiner

*Primary Examiner* — Melissa Koval
*Assistant Examiner* — Trung Nguyen
(74) *Attorney, Agent, or Firm* — Winston Hsu

(57) ABSTRACT

A test circuit includes a pull-up device, a pull-down device, a switch circuit and a voltage-setting unit. The pull-up device is used to receive a first control signal and coupled to a first end of the device-under-test. The pull-down device is used to receive a second control signal and coupled to the first end of the device-under-test. The switch unit is controlled by a switch signal, used to receive a testing signal and coupled to a second end of the device-under-test. The voltage-setting unit is controlled by a third control signal, used to pull the second end of the device-under-test to a predetermined voltage.

16 Claims, 5 Drawing Sheets when testing the device-under-test DUTi, keeping the voltage-setting unit 140i of the test circuit 100i of the test circuits 1001 to 100m coupled to the device-under-test DUTi turned off, and voltage-setting units 1401-140(i-1) and 140(i+1)-140m of test circuits 1001-100(i-1) and 100(i+1)-100m of the test circuits 1001-100m turned on

TEST CIRCUIT FOR TESTING A DEVICE-UNDER-TEST BY USING A VOLTAGE-SETTING UNIT TO PULL AN END OF THE DEVICE-UNDER-TEST TO A PREDETERMINED VOLTAGE

BACKGROUND OF THE INVENTION

1. Field of the Invention

The invention is related to a test circuit, and more specifically, a test circuit having a voltage-setting unit for pulling an end of a device-under-test to a predetermined voltage.

2. Description of the Prior Art

When testing a plurality of devices-under-test (DUT) such as a plurality of capacitors, if each device-under-test corresponds to one input/output pad for receiving testing signals and observing testing results, the interference occurred between the test paths each corresponding to a device-under-test may be well avoided since each of the test paths may be independent from one another. However, the number of the input/output pads of an integrated circuit is often smaller than the number of devices-under-test because the specification of the integrated circuit often limits the number of input/output pads. Thus the testing pad(s) are often shared by multiple devices-under-test. When a testing pad is shared by a plurality of devices-under-test, switches are disposed between the testing pad and each of the devices-under-test for disconnecting a test path when its corresponding device-under-test is not under test, and connecting the test path when the corresponding device-under-test is under test. However, unwanted interference between test paths may still occur via leakage paths which reduces the accuracy of the test result. The interference becomes more significant when the number of the devices-under-test sharing the same testing pad increases. Hence, a solution for reducing the interference generated by sharing an input/output pad and for improving the accuracy of test result when testing multiple devices-under-test is required in the field.

SUMMARY OF THE INVENTION

An embodiment of the present invention discloses a test circuit array for testing a plurality of devices-under-test. The test circuit array includes a plurality of test circuits, and each test circuit includes a pull-up device, a pull-down device, a switch unit and a voltage-setting unit. The pull-up device is used to receive a first control signal and coupled to a first end of a device-under-test. The pull-down device is used to receive a second control signal and coupled to the first end of the device-under-test. The switch unit is controlled by a switch signal, and used to receive a testing signal and coupled to a second end of the device-under-test. The voltage-setting unit is controlled by a third control signal, and used to pull the second end of the device-under-test to a predetermined voltage.

Another embodiment of the present invention discloses a test method for testing a plurality of devices-under-test by using a plurality of test circuits. Each of the test circuits includes a pull-up unit, a pull-down unit, a switch unit and a voltage-setting unit. The pull-up unit is coupled to a first end of a device-under-test of the plurality of devices-under-test. The pull-down unit is coupled to the pull-up unit and the first end of the device-under-test. The switch unit is coupled to a second end of the device-under-test and an input/output pad. The voltage-setting unit is coupled to a predetermined voltage source, the second end of the device-under-test and the switch unit. All switch units of the test circuits are coupled to the input/output pad. The method includes that when testing the device-under-test, keeping the voltage-setting unit of the test circuit of the test circuits coupled to the device-under-test turned off, and voltage-setting units of remaining test circuits of the test circuits turned on.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
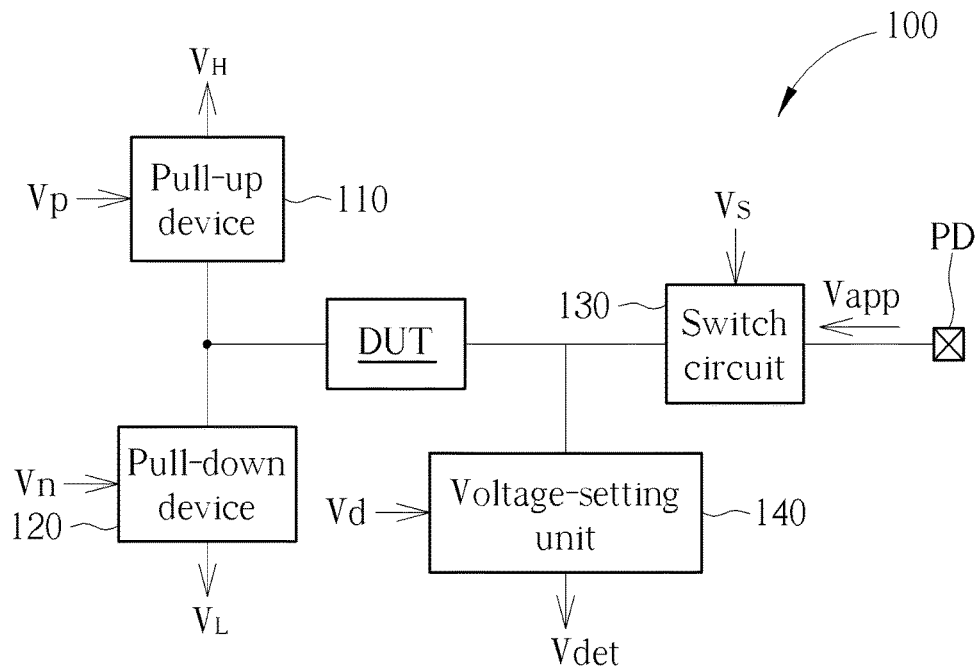
FIG. 1 illustrates a test circuit for testing a device-under-test according to an embodiment of the present invention.

FIG. 1 illustrates a test circuit 100 for testing a device-under-test DUT according to an embodiment of the present invention. The test circuit 100 may include a pull-up device 110, a pull-down device 120, a switch circuit 130 and a voltage-setting unit 140. The pull-up device 110 may be used to receive a first control signal Vp and coupled to a first end of the device-under-test DUT. The pull-down device 120 is used to receive a second control signal Vn and coupled to the first end of the device-under-test DUT. The switch unit 130 may be controlled by a switch signal Vs, used to receive a testing signal Vapp and coupled to a second end of the device-under-test DUT. The voltage-setting unit 140 may be controlled by a third control signal Vd, used to pull the second end of the device-under-test DUT to a predetermined voltage Vdet.

When the device-under-test DUT is under test, the switch circuit 130 may be turned on by the switch signal Vs, and the voltage-setting unit 140 may be turned off by the third control signal Vd for keeping a test path from a testing pad PD (that is an input/output pad) to the device-under-test DUT, the pull-up device 110 and the pull-down device 120. When the device-under-test DUT is not under test, the switch circuit 130 may be turned off by the switch signal Vs for cutting off the test path from the testing pad PD to the device-under-test DUT, the pull-up device 110 and the pull-down device 120, and the voltage-setting unit 140 may be turned on by the third control signal Vd for pulling the second end of the device-under-test DUT to the predetermined voltage Vdet for further reducing the coupling effect generated by the device-under-test DUT not under test. Hence, the test path of a device-under-test DUT not under test would not affect the accuracy of testing another deviceunder-test. The testing signal Vapp may be inputted to the switch circuit 130 via the input/output pad PD.

According to an embodiment, the third control signal Vd may be complementary to the switch signal Vs so that the switch circuit 130 may be turned on when the voltage-setting unit 140 is turned off, and the switch circuit 130 may be turned off when the voltage-setting unit 140 is turned on. The pull-up device 110 may be coupled to a high voltage source $V_H$, and the pull-down device 120 may be coupled to a low voltage source $V_L$ according to an embodiment. The device-under-test DUT may include a capacitor according to an embodiment of the present invention.

Figure 2:
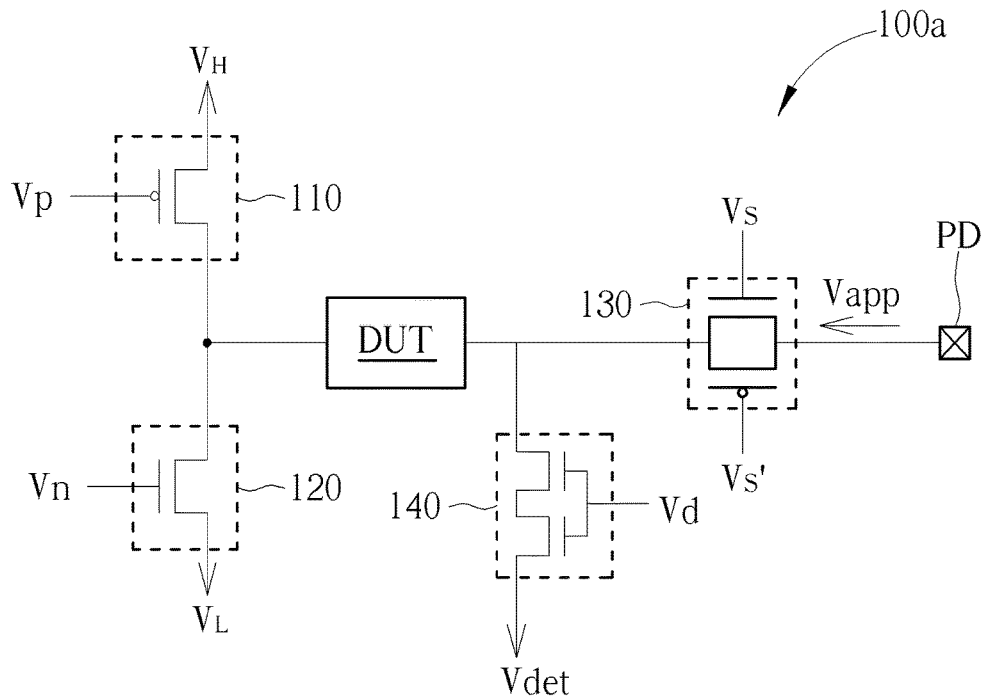
FIG. 2 illustrates a test circuit for testing the device-under-test according to another embodiment of the present invention.

FIG. 2 illustrates a test circuit 100a for testing the device-under-test DUT according to another embodiment of the present invention. As illustrated in FIG. 2, the pull-up unit 110 may be a first transistor including a first source end coupled to the high voltage source $V_H$, a first gate end used to receive the first control signal Vp, and a first drain end coupled to the first end of the device-under-test DUT. The pull-down unit 120 may be a second transistor including a second drain end coupled to the first drain end of the first transistor, a second gate end used to receive the second control signal Vn, and a second source end coupled to the low voltage source $V_L$. As illustrated in FIG. 2, the foresaid switch circuit 130 may include a transmission gate having a first end coupled to the second end of the device-under-test DUT, a control end used to receive the switch signal Vs, and a second end used to receive the testing signal Vapp. The transmission gate acting as the switch circuit 130 may be formed with two transistors such as a PMOS (P-type metal oxide semiconductor) and an NMOS (N-type metal oxide semiconductor). In a case that the transmission gate is formed by a PMOS and an NMOS, the NMOS may be controlled by the switch signal Vs while the PMOS is controlled by another switch signal Vs' being complementary to the switch signal Vs.

According to an embodiment of the present invention, the voltage-setting unit 140 may include at least one transistor having a first end coupled to the second end of the device-under-test DUT, a control end used to receive the third control signal Vd, and a second end coupled to the predetermined voltage source Vdet. In FIG. 2, the voltage-setting unit 140 is formed by two transistors connected to one another in a cascode manner. However, the embodiment shown in FIG. 2 is only an example rather than being used to limit the types of the structure of the voltage-setting unit 140. The number of transistors included in the voltage-setting unit 140 may be determined according to product specification, result of simulation, etc.

According to another embodiment, the control end of the at least one transistor in the voltage-setting unit 140 may be coupled to the control end of the transmission gate of the switch circuit 130. For example, the third control signal Vd and the switch signal Vs' (being complementary to the switch signal Vs) may be of a same signal. According to another embodiment, the foresaid predetermined voltage source Vdet may be the low voltage source $V_L$ coupled to the pull-down unit 120.

Figure 3:
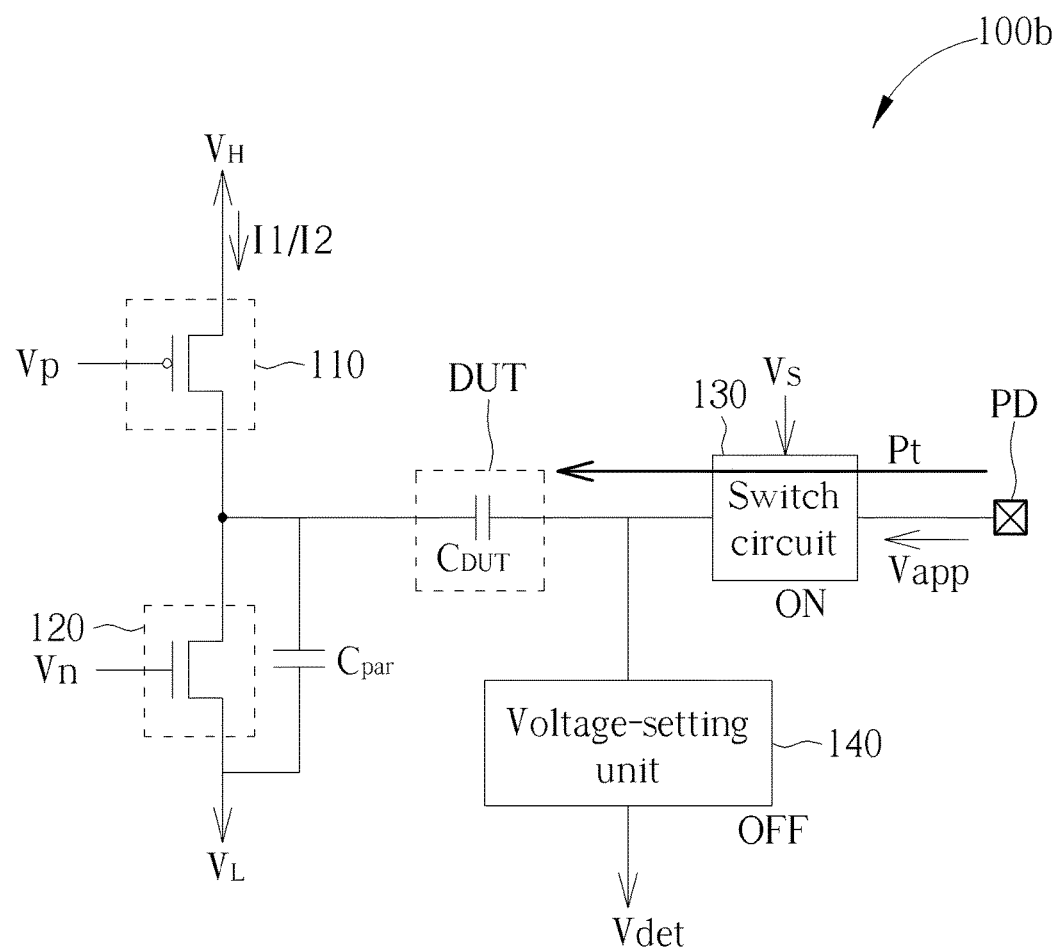
FIG. 3 illustrates a test circuit for testing a device-under-test being a capacitor according to another embodiment of the present invention.
Figure 4:
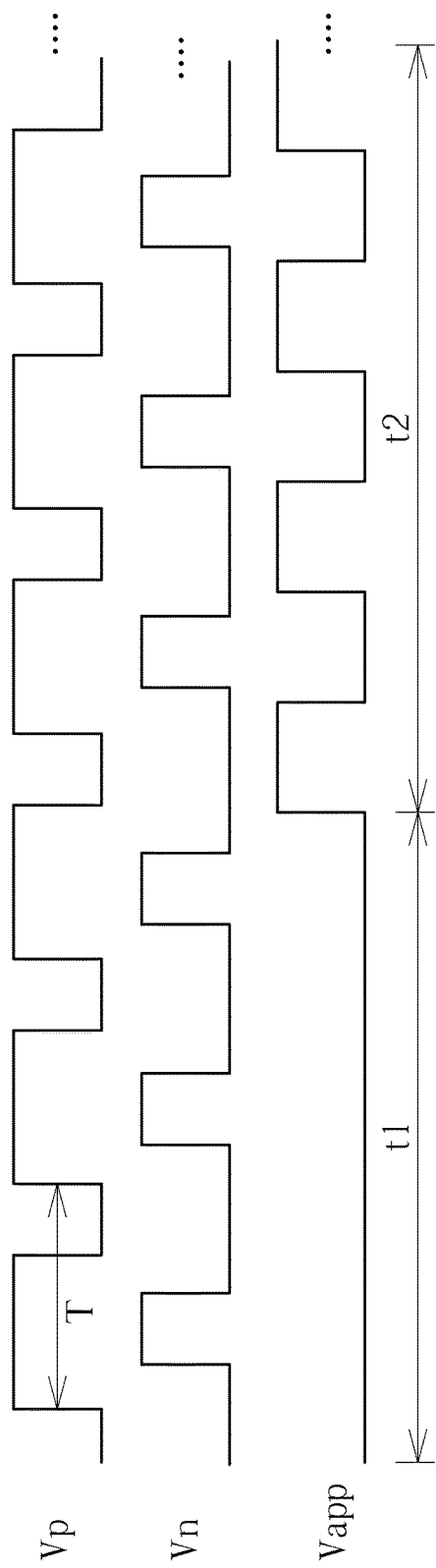
FIG. 4 illustrates a waveform diagram corresponding to the test circuit of FIG. 3.

FIG. 3 illustrates a test circuit 100b used for testing a device-under-test DUT being a capacitor $C_{DUT}$ according to another embodiment of the present invention. In FIG. 3, the capacitor $C_{par}$ may be a parasitic capacitor across the pull-down device 120. FIG. 4 illustrates a waveform diagram corresponding to the test circuit 100b of FIG. 3. As shown in FIG. 4, the testing signal Vapp may toggle between a low level of the low voltage source $V_L$ and a high level of the high voltage source $V_H$. The first control signal Vp and the second control signal Vn may also toggle between the high level and the low level. During the duration t1, the capacitor $C_{DUT}$ and the parasitic capacitor $C_{par}$ may be both charged when the first control signal Vp is of the low level and the second control signal Vn is of the low level since the PMOS of the pull-up device 110 is turned on and the NMOS of the pull-down device 120 is turned off. The capacitor $C_{DUT}$ and the parasitic capacitor $C_{par}$ may be both discharged when the first control signal Vp is of the high level and the second control signal Vn is of the high level since the PMOS of the pull-up device 110 is turned off and the NMOS of the pull-down device 120 is turned on. Since the capacitor $C_{DUT}$ and the parasitic capacitor $C_{par}$ may be charged and discharged concurrently during the duration t1, an average current I1 flowing through the pull-up device 110 during the duration t1 may be expressed as the equation (eq-1):

$$I1=(C_{DUT}+C_{par})\times V_H \times f \qquad (eq\text{-}1);$$

where the parameter f may be the frequency of the first control signal Vp, that is a reciprocal of the period T shown in FIG. 4. During the duration t2, only the parasitic capacitance $C_{par}$ may be charged when the first control signal Vp is of the low level and the second control signal Vn is of the low level. Since the testing signal Vapp is of the high level when the first control signal Vp is of the low level and the PMOS of the pull-up device 110 is turned on, the two ends of the capacitor $C_{DUT}$ may be of same voltage level so that the capacitor $C_{DUT}$ may not be charged. Hence, only the parasitic capacitance $C_{par}$ may be charged and discharged during the duration t2, and an average current I2 flowing through the pull-up device 110 during the duration t2 may be expressed as the equation (eq-2):

$$I2=C_{par}\times V_H \times f \qquad (eq\text{-}2).$$

The capacitance value of the capacitor $C_{DUT}$ of the device-under-test DUT may then be derived by the equation (eq-3) by using the equations (eq-1) and (eq-2):

$$C_{DUT}=(I1-I2)/(V_H \times f) \qquad (eq\text{-}3).$$

According to an embodiment of the present invention, the high voltage source $V_H$ may be coupled to the pull-up device 110 via an input/output pad of an integrated circuit, and the foresaid average current I1 and average current I2 may be measured at the input/output pad coupled to the high voltage source $V_H$. As shown in FIG. 3, when testing the device-under-test DUT by using the test circuit 100b, the switch circuit 130 may be turned on and the voltage-setting unit 140 may be turned off for enabling the test path Pt.

Figure 5:
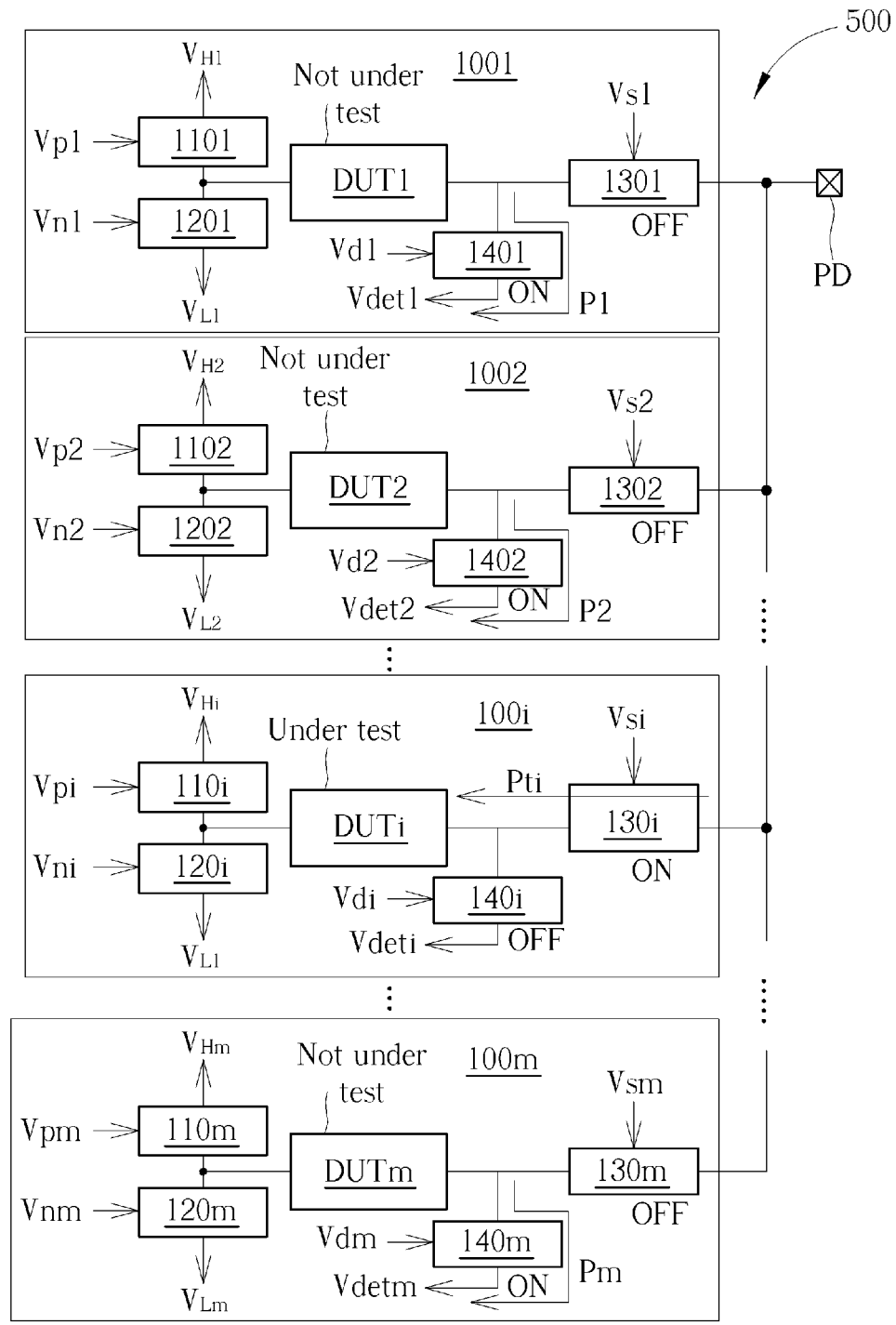
FIG. 5 illustrates a test circuit array according to an embodiment of the present invention.

FIG. 5 illustrates a test circuit array 500 according to an embodiment of the present invention. The test circuit array 500 is used for testing m devices-under-test DUT1 to DUTm where m is a positive integer larger than one. The test circuit array 300 may include m test circuits 1001 to 100m. Each of the test circuits 1001 to 100m may have a structure as described in FIG. 1. Taking the test circuits 100i for example (where i may be one of the integers 1 to m), the test circuit 100i may include a pull-up device 110i, a pull-down device 120i, a switch circuit 130i and a voltage-setting unit 140i. The pull-up device 110i may be used to receive a first control signal Vpi and coupled to a first end of a device-under-test DUTi. The pull-down device 120i may be used to receive a second control signal Vni and coupled to the first end of the device-under-test DUTi. The switch unit 130i may be controlled by a switch signal Vsi, used to receive a testing signal Vapp from an input/output pad PD and coupled to the input/output pad PD and a second end of the device-under-test DUTi. The voltage-setting unit 140i may be controlled by a third control signal Vdi, and used to pull the second end of the device-under-test DUTi to a predetermined voltage Vdeti. Since the structure of each of the test circuits 1001 to 100m may be similar to the structure illustrated in FIG. 1, it is not described for brevity. In FIG. 5, all switch circuits 1301 to 130m of the plurality of test circuits 1001-100m may be coupled to the input/output pad PD. In other words, the pad PD may be shared by the test circuits 1001-100m for testing the m devices-under-test DUT1 to DUTm.

Figure 6:
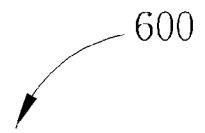
FIG. 6 illustrates a flow chart of a test method for testing m devices-under-test by using the test circuit array of FIG. 5.
Figure 6:

FIG. 6 illustrates a flow chart of a test method 600 for testing m devices-under-test DUT1 to DUTm by using the test circuit array 500 of FIG. 5. The test method 600 may include:

Step 610: when testing the device-under-test DUTi, keeping the voltage-setting unit 140i of the test circuit 100i of the test circuits 1001 to 100m coupled to the device-under-test DUTi turned off, and voltage-setting units 1401-140(i−1) and 140(i+1)-140m of test circuits 1001-100(i−1) and 100(i+1)-100m of the test circuits 1001-100m turned on.

As shown in FIG. 5, when the device-under-test DUTi is under test, the switch circuit 130i may be turned on and the voltage-setting unit 140i may be turned off so as to enable a test path Pti. The voltage-setting units 1401-140(i−1) and 140(i+1)-140m may be turned on so as to provide pull-down paths P1-P(i−1) and P(i+1)-Pm for pulling down an end of each of the switch circuits 1301-130(i−1) and 130(i+1) to 130m. The switch circuits 1301-130(i−1) and 130(i+1) to 130m may be turned off to cut off the test paths of the test circuits 1001-100(i−1) and 100(i+1)-100m. The test circuits 1001-100(i−1) and 100(i+1)-100m may therefore not to affect the test path Pti, and the accuracy of testing the device-under-test DUTi is improved.

In Step 610, the step may be performed by inputting a first voltage to the voltage-setting unit 140i of the test circuit of the test circuits 1401-140m coupled to the device-under-test DUTi and inputting a second voltage to the voltage-setting units 104-140(i−1) and 104(i+1)-140m of the remaining test circuits 1001-100(i−1) and 100(i+1)-100m. The first voltage is complementary to the second voltage.

According to an embodiment of the present invention, when testing the device-under-test 140i, keeping the switch unit 130i coupled to the voltage-setting unit 140i of the test circuit 100i of the test circuits 1001-100m coupled to the device-under-test DUTi turned on may be achieved by inputting the second voltage to the switch unit 130i, and keeping the switch units 1301-130(i−1) and 130(i+1)-130m coupled to the voltage-setting units 1401-140(i−1) and 140(i+1)-140m of the remaining test circuits 1001-100(i−1) and 100(i+1)-100m turned off may be achieved by inputting the first voltage to the switch units 1301-130(i−1) and 130(i+1)-130m. The voltage-setting unit 140i of the test circuit 100i coupled to the device-under-test DUTi may include a P-type metal-oxide-semiconductor (PMOS) field-effect transistor, and the switch unit 130i coupled to the voltage-setting unit 140i of the test circuit 100i coupled to the device-under-test DUTi may include another PMOS field-effect transistor. In another case, the voltage-setting unit 140i of the test circuit 100i coupled to the device-under-test DUTi may include an N-type metal-oxide-semiconductor (NMOS) field-effect transistor, and the switch unit 130i coupled to the voltage-setting unit 140i of the test circuit 100i coupled to the device-under-test DUTi may include another NMOS field-effect transistor. Since a control voltage of a PMOS transistor may be complementary to a control voltage of an NMOS transistor, the types of transistors included in the voltage-setting unit 140i and the switch unit 130i may be planned as described above.

According to another embodiment of the present invention, when testing the device-under-test 140i, keeping the switch unit 130i coupled to the voltage-setting unit 140i of the test circuit 100i of the test circuits 1001-100m coupled to the device-under-test DUTi turned on may be achieved by inputting the first voltage to the switch unit 130i, and keeping the switch units 1301-130(i−1) and 130(i+1)-130m coupled to the voltage-setting units 1401-140(i−1) and 140(i+1)-140m of the remaining test circuits 1001-100(i−1) and 100(i+1)-100m turned off may be achieved by inputting the second voltage to the switch units 1301-130(i−1) and 130(i+1)-130m. According to this embodiment, the voltage-setting unit 140i of the test circuit 100i coupled to the device-under-test DUTi may include an NMOS field-effect transistor, and the switch unit 130i coupled to the voltage-setting unit 140i of the test circuit 100i coupled to the device-under-test DUTi may include a PMOS field-effect transistor. According to this embodiment, in another case, the voltage-setting unit 140i of the test circuit 100i coupled to the device-under-test DUTi may include a PMOS field-effect transistor, and the switch unit 130i coupled to the voltage-setting unit 140i of the test circuit 100i coupled to the device-under-test DUTi may include an NMOS field-effect transistor.

The table-1 below shows an experimental result by using the test method 600 and the test circuit array 500 including a plurality of test circuit 100 according to an embodiment of the present invention. in table-1, each device-under-test my be a capicitor.

TABLE 1

| Number of the device-under-test | Previous approach | | Approach according to the present invention | |
|---|---|---|---|---|
| (Each capacitor under test is of 250 Farad theoretically) | Tested value of each tested device (Farad) | Error | Tested value of each tested device (Farad) | Error |
| 1 | 250.035 | 0.0014% | 250.0185 | 0.00074% |
| 40 | 248.643 | 0.54279% | 250.0156 | 0.00625% |
| 100 | 245.940 | 1.62226% | 250.5029 | 0.20118% |

It can be seen that when the number of the device-under-test increases, the accuracy of the result of the testing may decrease, and the error may increase. However, by using the test method and the test circuit array including a plurality of test circuit disclosed by the embodiments of the present invention, the accuracy of the test result may be well improved. Hence, the test circuit, the test circuit array and the test method of the present invention may improve the test result effectively, especially when the testing pad is shared.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test circuit array for testing a plurality of devices-under-test, the test circuit array comprising a plurality of test circuits, each test circuit comprising:
    a pull-up device being a first transistor comprising a first source end coupled to a high voltage source, a first gate end configured to receive a first control signal, and a first drain end coupled to a first end of a device-under-test;

a pull-down device being a second transistor comprising a second drain end coupled to the first drain end of the first transistor, a second gate end configured to receive a second control signal, and a second source end coupled to a low voltage source;

a switch unit, controlled by a switch signal, configured to receive a testing signal and coupled to a second end of the device-under-test; and a voltage-setting unit, controlled by a third control signal, and configured to pull the second end of the device-under-test to a predetermined voltage.

2. The test circuit array of claim 1, wherein all switch units of the plurality of test circuits are coupled to an input/output pad.

3. The test circuit array of claim 1, wherein the third control signal is complementary to the switch signal.

4. The test circuit array of claim 1, wherein the pull-up device is coupled to a high voltage source, and the pull-down device is coupled to a low voltage source.

5. The test circuit array of claim 1, wherein the switch unit comprises a transmission gate having a first end coupled to the second end of the device-under-test, a control end configured to receive the switch signal, and a second end coupled to the input/output pad.

6. The test circuit array of claim 5, wherein the voltage-setting unit comprises at least one transistor having a first end coupled to the second end of the device-under-test, a control end configured to receive the third control signal, and a second end coupled to the predetermined voltage source.

7. The test circuit array of claim 6, wherein the control end of the at least one transistor is coupled to the control end of the transmission gate.

8. The test circuit array of claim 1, wherein the predetermined voltage source is a low voltage source.

9. A test method for testing a plurality of devices-under-test by using a plurality of test circuits, each of the test circuits comprising a pull-up unit, a pull-down unit, a switch unit and a voltage-setting unit, the pull-up unit being coupled to a first end of a device-under-test of the plurality of devices-under-test, the pull-down unit being coupled to the pull-up unit and the first end of the device-under-test, the switch unit being coupled to a second end of the device-under-test and an input/output pad, the voltage-setting unit being coupled to a predetermined voltage source, the second end of the device-under-test and the switch unit, all switch units of the test circuits being coupled to the input/output pad, and the method comprising:

when testing the device-under-test, inputting a first voltage to the voltage-setting unit of the test circuit of the test circuits coupled to the device-under-test to turn off the voltage-setting unit of the test circuit of the test circuits coupled to the device-under-test, and inputting a second voltage to the voltage-setting units of the remaining test circuits to turn on the voltage-setting units of the remaining test circuits;

wherein the first voltage is complementary to the second voltage.

10. The test method of claim 9, further comprising:

when testing the device-under-test, keeping the switch unit coupled to the voltage-setting unit of the test circuit of the test circuits coupled to the device-under-test turned on by inputting the second voltage to the switch unit, and keeping the switch units coupled to the voltage-setting units of the remaining test circuits turned off by inputting the first voltage to the switch units of the remaining test circuits.

11. The test method of claim 10, wherein the voltage-setting unit of the test circuit of the test circuits coupled to the device-under-test comprises a P-type metal-oxide-semiconductor field-effect transistor, and the switch unit coupled to the voltage-setting unit of the test circuit of the test circuits coupled to the device-under-test comprises another P-type metal-oxide-semiconductor field-effect transistor.

12. The test method of claim 10, wherein the voltage-setting unit of the test circuit of the test circuits coupled to the device-under-test comprises an N-type metal-oxide-semiconductor field-effect transistor, and the switch unit coupled to the voltage-setting unit of the test circuit of the test circuits coupled to the device-under-test comprises another N-type metal-oxide-semiconductor field-effect transistor.

13. The test method of claim 10, further comprising:

when testing the device-under-test, keeping the switch unit coupled to the voltage-setting unit of the test circuit of the test circuits coupled to the device-under-test turned on by inputting the first voltage to the switch unit, and keeping the switch units coupled to the voltage-setting units of the remaining test circuits turned off by inputting the second voltage to the switch units of the remaining test circuits.

14. The test method of claim 13, wherein the voltage-setting unit of the test circuit of the test circuits coupled to the device-under-test comprises an N-type metal-oxide-semiconductor field-effect transistor, and the switch unit coupled to the voltage-setting unit of the test circuit of the test circuits coupled to the device-under-test comprises a P-type metal-oxide-semiconductor field-effect transistor.

15. The test method of claim 13, wherein the voltage-setting unit of the test circuit of the test circuits coupled to the device-under-test comprises a P-type metal-oxide-semiconductor field-effect transistor, and the switch unit coupled to the voltage-setting unit of the test circuit of the test circuits coupled to the device-under-test comprises an N-type metal-oxide-semiconductor field-effect transistor.

16. A test circuit array for testing a plurality of devices-under-test, the test circuit array comprising a plurality of test circuits, each test circuit comprising:

a pull-up device configured to receive a first control signal and coupled to a first end of a device-under-test;

a pull-down device configured to receive a second control signal and coupled to the first end of the device-under-test;

a switch unit comprising a transmission gate having a first end coupled to a second end of the device-under-test, a control end configured to receive a switch signal, and a second end coupled to the input/output pad for receiving a testing signal; and a voltage-setting unit, controlled by a third control signal, and configured to pull the second end of the device-under-test to a predetermined voltage.

* * * * *